US012028595B2

(12) United States Patent
Chuang et al.

(10) Patent No.: US 12,028,595 B2
(45) Date of Patent: Jul. 2, 2024

(54) PORTABLE ELECTRONIC DEVICE AND IMAGE-CAPTURING MODULE THEREOF

(71) Applicant: AZUREWAVE TECHNOLOGIES, INC., New Taipei (TW)

(72) Inventors: Chih-Yuan Chuang, New Taipei (TW); Chien-Che Ting, New Taipei (TW)

(73) Assignee: AZUREWAVE TECHNOLOGIES, INC., New Taipei (TW)

( * ) Notice: Subject to any disclaimer, the term of this patent is extended or adjusted under 35 U.S.C. 154(b) by 8 days.

(21) Appl. No.: 17/531,968

(22) Filed: Nov. 22, 2021

(65) Prior Publication Data

US 2023/0068132 A1 Mar. 2, 2023

(30) Foreign Application Priority Data

Sep. 1, 2021 (TW) ................................. 110132465

(51) Int. Cl.
*H04N 23/54* (2023.01)
*H04N 23/55* (2023.01)
*H05K 1/02* (2006.01)

(52) U.S. Cl.
CPC ............ *H04N 23/54* (2023.01); *H04N 23/55* (2023.01); *H05K 1/0271* (2013.01); *H05K 1/0274* (2013.01); *H05K 2201/10121* (2013.01); *H05K 2201/10151* (2013.01); *H05K 2201/10674* (2013.01)

(58) Field of Classification Search
CPC ...... H04N 23/54; H04N 23/55; H05K 1/0271; H05K 1/0274; H05K 2201/10121; H05K 2201/10151; H05K 2201/10674
See application file for complete search history.

(56) References Cited

U.S. PATENT DOCUMENTS

| 2013/0250169 | A1* | 9/2013 | Kim | .......... H04N 23/57 |
| | | | | 348/374 |
| 2014/0375875 | A1* | 12/2014 | Yeo | .......... G02B 7/08 |
| | | | | 348/373 |

(Continued)

FOREIGN PATENT DOCUMENTS

TW  M532588 M  11/2016

*Primary Examiner* — Jason A Flohre
(74) *Attorney, Agent, or Firm* — Li & Cai Intellectual Property (USA) Office

(57) ABSTRACT

A portable electronic device and an image-capturing module thereof are provided. The image-capturing module includes a circuit substrate, an image sensing chip, a rigidity reinforcing structure, and a lens assembly. The circuit substrate has a plurality of conductive substrate contacts. The image sensing chip is disposed on the circuit substrate and electrically connected to the circuit substrate. The image sensing chip includes an image sensing region, and a plurality of conductive chip contacts respectively and electrically connected to the conductive substrate contacts. The rigidity reinforcing structure is disposed on the circuit substrate. The lens assembly includes a lens holder and a lens structure disposed on the lens holder, and the lens structure corresponds to the image sensing region. A perpendicular projection of each of the conductive substrate contacts and a perpendicular projection of each of the conductive chip contacts can be shown on the rigidity reinforcing structure.

4 Claims, 11 Drawing Sheets

(56) References Cited

U.S. PATENT DOCUMENTS

| | | | |
|---|---|---|---|
| 2019/0141224 A1* | 5/2019 | Park | G03B 11/00 |
| 2019/0174087 A1* | 6/2019 | Kim | H04N 23/54 |
| 2021/0127040 A1* | 4/2021 | Wang | H04N 23/55 |
| 2021/0168945 A1* | 6/2021 | Kim | G02B 7/02 |
| 2021/0176856 A1* | 6/2021 | Chen | H04N 23/55 |
| 2021/0281721 A1* | 9/2021 | Momiuchi | H04N 23/00 |
| 2022/0279137 A1* | 9/2022 | Lasiter | H01L 27/14618 |

* cited by examiner

PORTABLE ELECTRONIC DEVICE AND IMAGE-CAPTURING MODULE THEREOF

CROSS-REFERENCE TO RELATED PATENT APPLICATION

This application claims the benefit of priority to Taiwan Patent Application No. 110132465, filed on Sep. 1, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a portable electronic device and an image-capturing module thereof, and more particularly to an image-capturing module for increasing a structural strength and a surface flatness of a circuit substrate, and a portable electronic device configured for using the image-capturing module.

BACKGROUND OF THE DISCLOSURE

In the related art, when a circuit substrate for carrying an image sensing chip is bent, an electrical connection relationship between the image sensing chip and the circuit substrate is damaged, so that a short-circuit and an open-circuit fault are occurred between the image sensing chip and the circuit substrate.

SUMMARY OF THE DISCLOSURE

In response to the above-referenced technical inadequacy, the present disclosure provides a portable electronic device and an image-capturing module thereof.

In one aspect, the present disclosure provides an image-capturing module, which includes a circuit substrate, an image sensing chip, a rigidity reinforcing structure, and a lens assembly. The circuit substrate has a plurality of conductive substrate contacts. The image sensing chip is disposed on the circuit substrate and electrically connected to the circuit substrate. The image sensing chip includes an image sensing region, and a plurality of conductive chip contacts respectively and electrically connected to the conductive substrate contacts. The rigidity reinforcing structure is disposed on the circuit substrate. The lens assembly includes a lens holder and a lens structure disposed on the lens holder, and the lens structure of the lens assembly corresponds to the image sensing region of the image sensing chip. A perpendicular projection of each of the conductive substrate contacts and a perpendicular projection of each of the conductive chip contacts are on the rigidity reinforcing structure.

In another aspect, the present disclosure provides a portable electronic device configured for using an image-capturing module. The image-capturing module includes a circuit substrate, an image sensing chip, a rigidity reinforcing structure, and a lens assembly. The circuit substrate has a plurality of conductive substrate contacts. The image sensing chip is disposed on the circuit substrate and electrically connected to the circuit substrate. The image sensing chip includes an image sensing region, and a plurality of conductive chip contacts respectively and electrically connected to the conductive substrate contacts. The rigidity reinforcing structure is disposed on the circuit substrate. The lens assembly includes a lens holder and a lens structure disposed on the lens holder, and the lens structure of the lens assembly corresponds to the image sensing region of the image sensing chip. A perpendicular projection of each of the conductive substrate contacts and a perpendicular projection of each of the conductive chip contacts are on the rigidity reinforcing structure.

In certain embodiments, the circuit substrate has a top surface, a bottom surface opposite to the top surface, and a through hole connected between the top surface and the bottom surface. The conductive substrate contacts are disposed on the bottom surface of the circuit substrate, the image sensing chip is disposed on the bottom surface of the circuit substrate, and the conductive chip contacts of the image sensing chip are respectively and electrically to the conductive substrate contacts of the circuit substrate by flip chip bonding. The rigidity reinforcing structure is surroundingly disposed on the top surface of the circuit substrate and surrounds the through hole, and the lens holder of the lens assembly is adhered to the rigidity reinforcing structure through an adhesive layer. The rigidity reinforcing structure has an outer surrounding periphery, and the outer surrounding periphery of the rigidity reinforcing structure is covered or exposed by the lens holder. The top surface of the circuit substrate has a surrounding unoccupied region connected to the through hole and surrounding the through hole, and the surrounding unoccupied region of the top surface of the circuit substrate is surrounded and exposed by the rigidity reinforcing structure. The bottom surface of the circuit substrate has a surrounding contact region surrounding the through hole for carrying the conductive substrate contacts, the top surface of the circuit substrate has a structure reinforcing region surrounding the surrounding unoccupied region and corresponding to the surrounding contact region, and the rigidity reinforcing structure is completely or partially disposed on the structure reinforcing region so as to increase a structural strength and a surface flatness of the structure reinforcing region of the circuit substrate, and a structural strength and a surface flatness of the surrounding contact region of the circuit substrate.

In certain embodiments, the circuit substrate has a top surface, and a bottom surface opposite to the top surface. The conductive substrate contacts are disposed on the top surface of the circuit substrate, and the conductive chip contacts of the image sensing chip are respectively and electrically to the conductive substrate contacts of the circuit substrate by wire bonding. The rigidity reinforcing structure is disposed on the bottom surface of the circuit substrate, the lens holder of the lens assembly is adhered to the circuit substrate through an adhesive layer, and a perpendicular projection of the lens holder of the lens assembly is on the rigidity reinforcing structure. The top surface of the circuit substrate has a surrounding contact region surrounding the image sensing chip for carrying the conductive substrate contacts, the bottom surface of the circuit substrate has a structure reinforcing region corresponding to the surrounding contact region, and the rigidity reinforcing structure is completely or partially disposed on the structure reinforcing region so as to increase a structural strength and a surface flatness of the structure reinforcing region of the circuit substrate, and a structural strength and a surface flatness of the surrounding contact region of the circuit substrate. The circuit substrate has a though hole connected between the top surface and the bottom surface, and the image sensing chip is received inside the through hole and disposed on the rigidity reinforcing structure.

Therefore, in the portable electronic device and the image-capturing module provided by the present disclosure, by virtue of "the rigidity reinforcing structure being disposed on the circuit substrate" and "the perpendicular projection of each of the conductive substrate contacts and the perpendicular projection of each of the conductive chip contacts being shown on the rigidity reinforcing structure," a structural strength and a surface flatness of a predetermined region of the circuit substrate can be increased.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
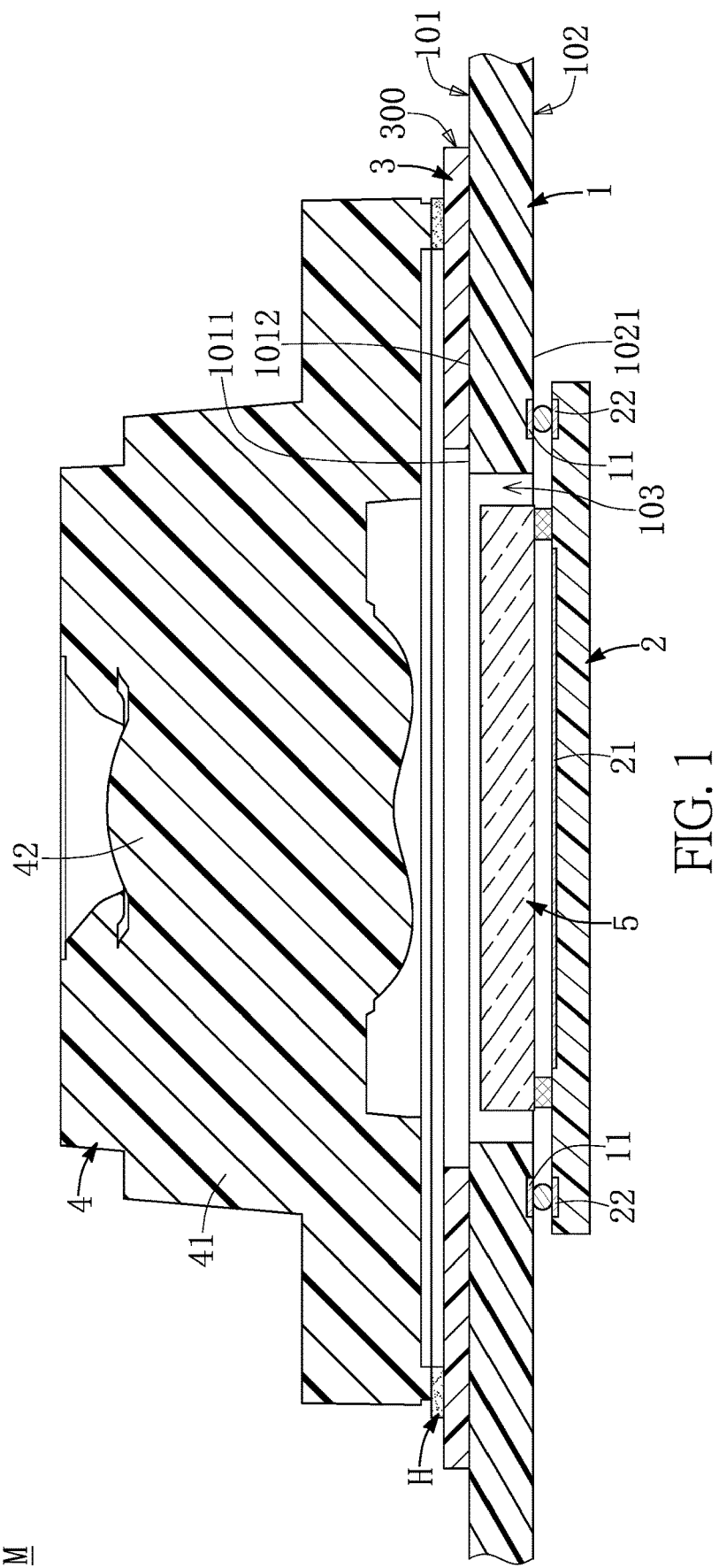
FIG. 1 is a partial schematic cross-sectional view of an image-capturing module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 10, the present disclosure provides an image-capturing module M and a portable electronic device P configured for using the image-capturing module M, and the image-capturing module M includes a circuit substrate 1, an image sensing chip 2, a rigidity reinforcing structure 3, and a lens assembly 4. More particularly, the circuit substrate 1 has a plurality of conductive substrate contacts 11. The image sensing chip 2 is disposed on the circuit substrate 1 and electrically connected to the circuit substrate 1, and the image sensing chip 2 includes an image sensing region 21, and a plurality of conductive chip contacts 22 respectively and electrically connected to the conductive substrate contacts 11. The rigidity reinforcing structure 3 is disposed on the circuit substrate 1. The lens assembly 4 includes a lens holder 41 and a lens structure 42 disposed on the lens holder 41, and the lens structure 42 of the lens assembly 4 corresponds to the image sensing region 21 of the image sensing chip 2. It should be noted that a perpendicular projection of each of the conductive substrate contacts 11 and a perpendicular projection of each of the conductive chip contacts 22 can be shown on the rigidity reinforcing structure 3.

Therefore, in the portable electronic device P and the image-capturing module M provided by the present disclosure, a structural strength and a surface flatness (or planarity) of a predetermined region (such as a region for carrying the conductive substrate contacts 11) of the circuit substrate 1 can be increased by virtue of "the rigidity reinforcing structure 3 being disposed on the circuit substrate 1" and "the perpendicular projection of each of the conductive substrate contacts 11 and the perpendicular projection of each of the conductive chip contacts 22 being shown on the rigidity reinforcing structure 3."

First Embodiment

Figure 2:
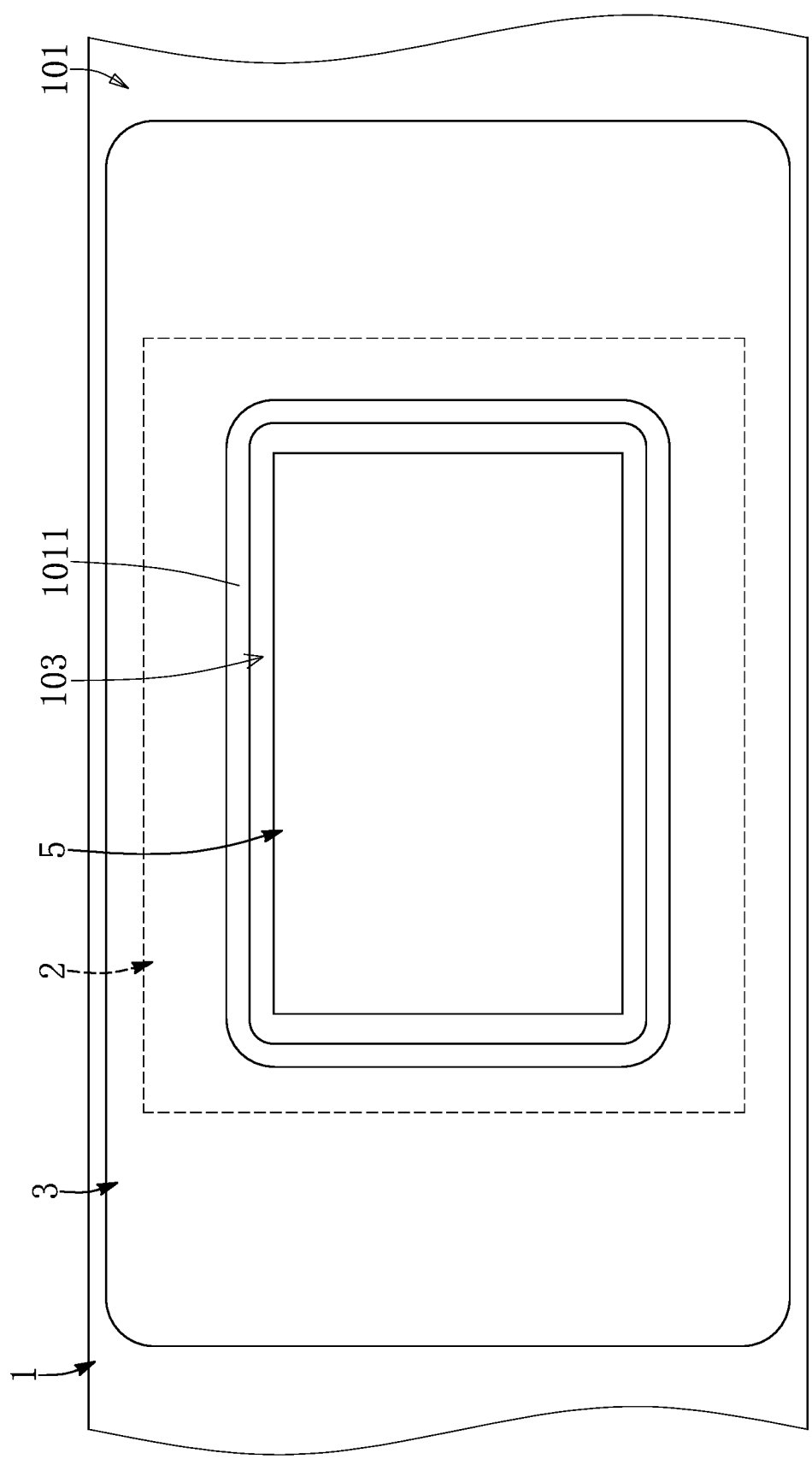
FIG. 2 is a partial schematic top view of the image-capturing module according to the first embodiment of the present disclosure.

Referring to FIG. 1 and FIG. 2, a first embodiment of the present disclosure provides an image-capturing module M, which includes a circuit substrate 1, an image sensing chip 2, a rigidity reinforcing structure 3 (or a rigidity strengthening structure, or a flexibility strengthening structure, or a toughness strengthening structure), and a lens assembly 4.

Firstly, as shown in FIG. 1, the circuit substrate 1 has a plurality of conductive substrate contacts 11. In addition, the image sensing chip 2 is disposed on the circuit substrate 1 and electrically connected to the circuit substrate 1, and the image sensing chip 2 includes an image sensing region 21, and a plurality of conductive chip contacts 22 respectively and electrically connected to the conductive substrate contacts 11. For example, the circuit substrate 1 has a top surface 101, a bottom surface 102 opposite to the top surface 101, and a through hole 103 connected between the top surface 101 and the bottom surface 102. The conductive substrate contacts 11 can be disposed on the bottom surface 102 of the circuit substrate 1, the image sensing chip 2 can be disposed on the bottom surface 102 of the circuit substrate 1, and the conductive chip contacts 22 of the image sensing chip 2 can be respectively and electrically to the conductive substrate contacts 11 of the circuit substrate 1 through a plurality of conductive material (not labeled, such as solder balls or solder paste) by flip chip bonding. However, the aforementioned description of the first embodiment is merely an example, and is not meant to limit the scope of the present disclosure.

Moreover, referring to FIG. 1 and FIG. 2, the rigidity reinforcing structure 3 is disposed on the circuit substrate 1. In addition, the lens assembly 4 includes a lens holder 41 and a lens structure 42 disposed on the lens holder 41, and the lens structure 42 of the lens assembly 4 corresponds to the image sensing region 21 of the image sensing chip 2. For example, the rigidity reinforcing structure 3 can be made of rubber, silicone, or any material configured for increasing rigidity, flexibility or toughness, and the rigidity reinforcing structure 3 can also be made of conductive material. Moreover, the rigidity reinforcing structure 3 can be surroundingly disposed on the top surface 101 of the circuit substrate 1 for surrounding the through hole 103, and the lens holder 41 of the lens assembly 4 can be adhered to the rigidity reinforcing structure 3 through an adhesive layer H, so that a structural stability of the lens holder 41 of the lens assembly 4 can be increased by using the rigidity reinforcing structure 3. Therefore, even if the circuit substrate 1 is bent by an external force, the possibility of separating the lens assembly 4 from the image-capturing module M can be decreased by using the rigidity reinforcing structure 3. However, the aforementioned description of the first embodiment is merely an example, and is not meant to limit the scope of the present disclosure.

It should be noted that, for example, referring to FIG. 1 and FIG. 2, the rigidity reinforcing structure 3 has an outer surrounding periphery 300, and the outer surrounding periphery 300 of the rigidity reinforcing structure 3 can be covered (not shown in figures) or exposed (as shown in FIG. 1) by the lens holder 41. That is to say, when a perpendicular projection of each of the conductive substrate contacts 11 and a perpendicular projection of each of the conductive chip contacts 22 are on the rigidity reinforcing structure 3, the outer surrounding periphery 300 of the rigidity reinforcing structure 3 can be reduced so as to be covered by the lens holder 41 (not shown in figures), or can be extended outward so as to be exposed by the lens holder 41 (as shown in FIG. 1). In addition, the top surface 101 of the circuit substrate 1 has a surrounding unoccupied region 1011 (such as a surrounding clear region) connected to the through hole 103 and surrounding the through hole 103, and the surrounding unoccupied region 1011 of the top surface 101 of the circuit substrate 1 can be surrounded and exposed by the rigidity reinforcing structure 3. Moreover, the bottom surface 102 of the circuit substrate 1 has a surrounding contact region 1021 surrounding the through hole 103 for carrying the conductive substrate contacts 11, the top surface 101 of the circuit substrate 1 has a structure reinforcing region 1012 surrounding the surrounding unoccupied region 1011 and corresponding to the surrounding contact region 1021, and the rigidity reinforcing structure 3 is completely or partially disposed on the structure reinforcing region 1012 so as to increase a structural strength and a surface flatness of the structure reinforcing region 1012 of the circuit substrate 1, and increase a structural strength and a surface flatness of the surrounding contact region 1021 of the circuit substrate 1. Therefore, even if the circuit substrate 1 is bent by an external force, the possibility of separating each conductive material (such as a solder ball or solder paste) from the corresponding conductive substrate contact 11 and the corresponding conductive chip contact 22 can be decreased by using the rigidity reinforcing structure 3. However, the aforementioned description of the first embodiment is merely an example, and is not meant to limit the scope of the present disclosure.

For example, referring to FIG. 1 and FIG. 2, the image-capturing module M provided by the first embodiment of the present disclosure further includes an optical filter element 5 disposed on the image sensing chip 2 so as to correspond to the image sensing region 21 of the image sensing chip 2. It should be noted that, when the optical filter element 5 is disposed on the image sensing chip 2, the optical filter element 5 is completely received inside the through hole 103 of the circuit substrate 1. However, the aforementioned description of the first embodiment is merely an example, and is not meant to limit the scope of the present disclosure.

Second Embodiment

Figure 3:
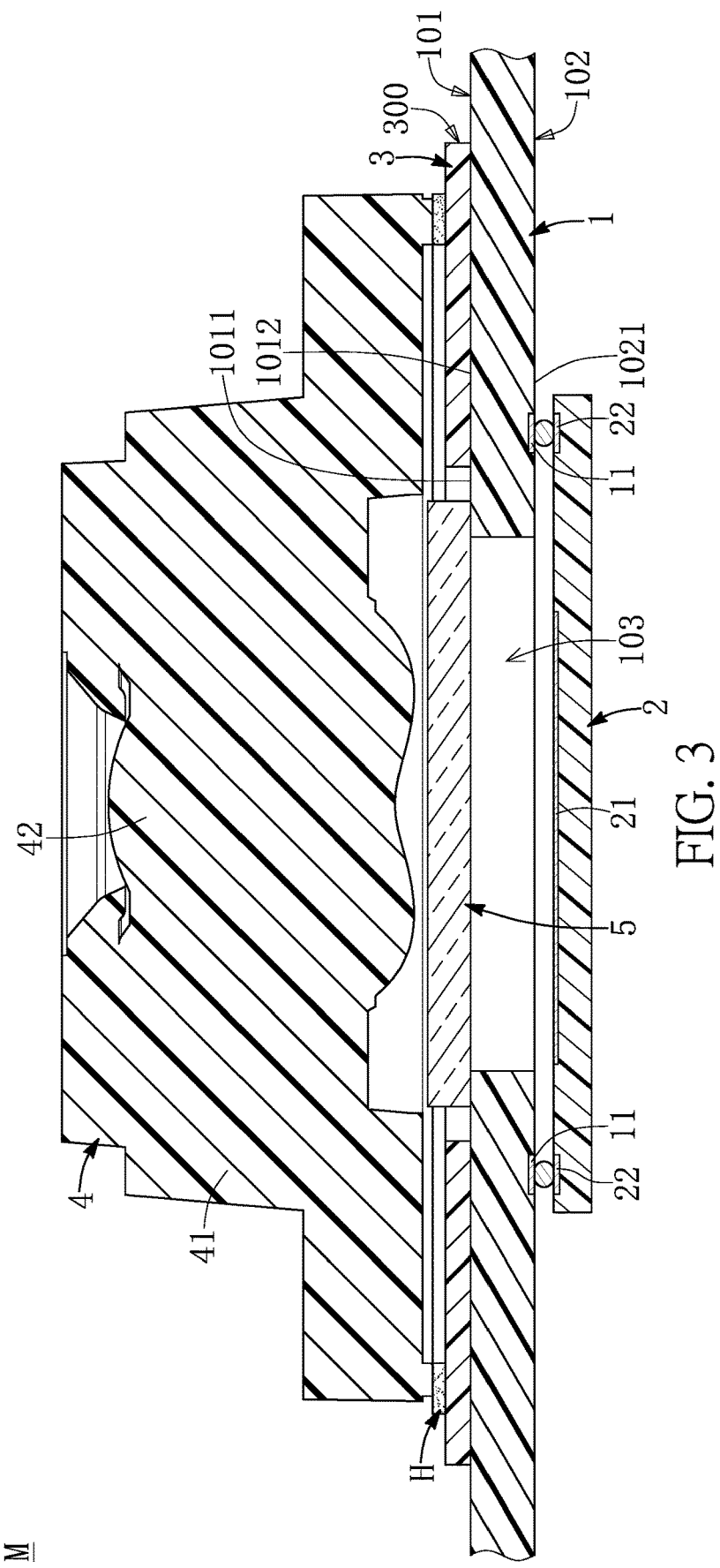
FIG. 3 is a partial schematic cross-sectional view of the image-capturing module according to a second embodiment of the present disclosure.

Referring to FIG. 3, a second embodiment of the present disclosure provides an image-capturing module M, which includes a circuit substrate 1, an image sensing chip 2, a rigidity reinforcing structure 3, and a lens assembly 4. Comparing FIG. 3 with FIG. 1, the main difference between the second embodiment and the first embodiment is as follows: in the second embodiment, the optical filter element 5 is disposed on the circuit substrate 1 so as to correspond to the image sensing region 21 of the image sensing chip 2. When the optical filter element 5 is disposed on the circuit substrate 1, the through hole 103 of the circuit substrate 1 is enclosed by the optical filter element 5. That is to say, the optical filter element 5 can be disposed on the image sensing chip 2 (as shown in the first embodiment of FIG. 1) or the circuit substrate 1 (as shown in the second embodiment of FIG. 3) according to different requirements.

Third Embodiment

Figure 4:
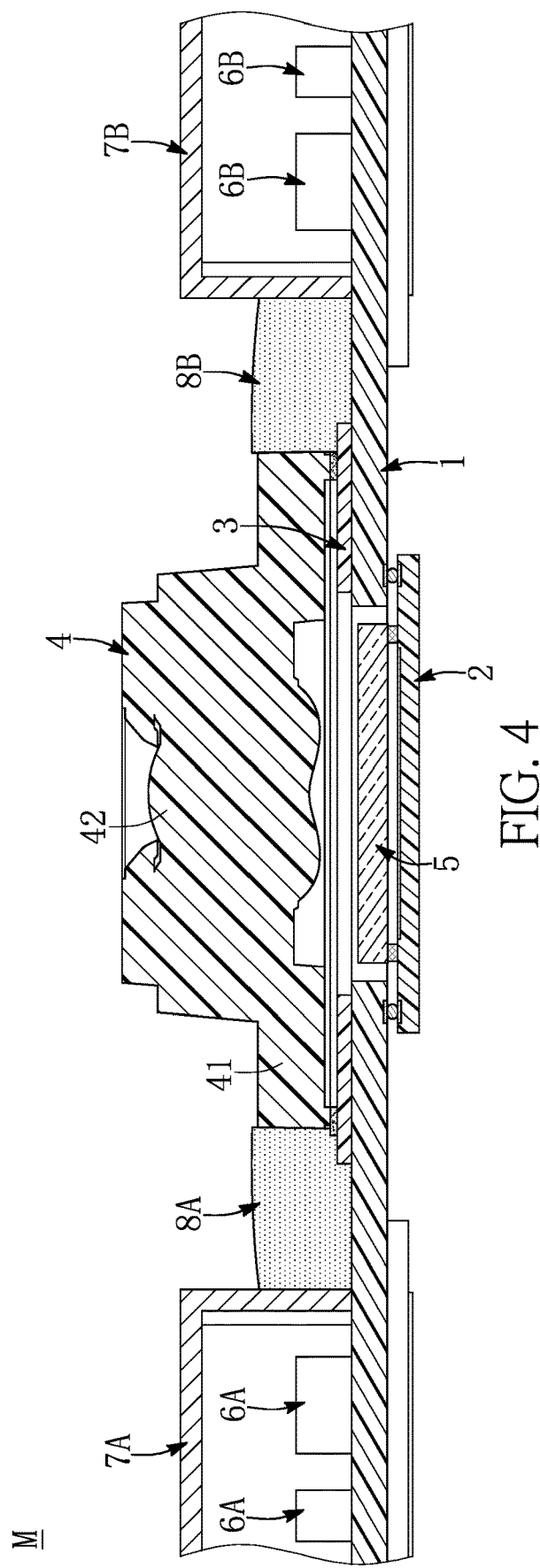
FIG. 4 is a partial schematic cross-sectional view of the image-capturing module according to a third embodiment of the present disclosure.
Figure 5:
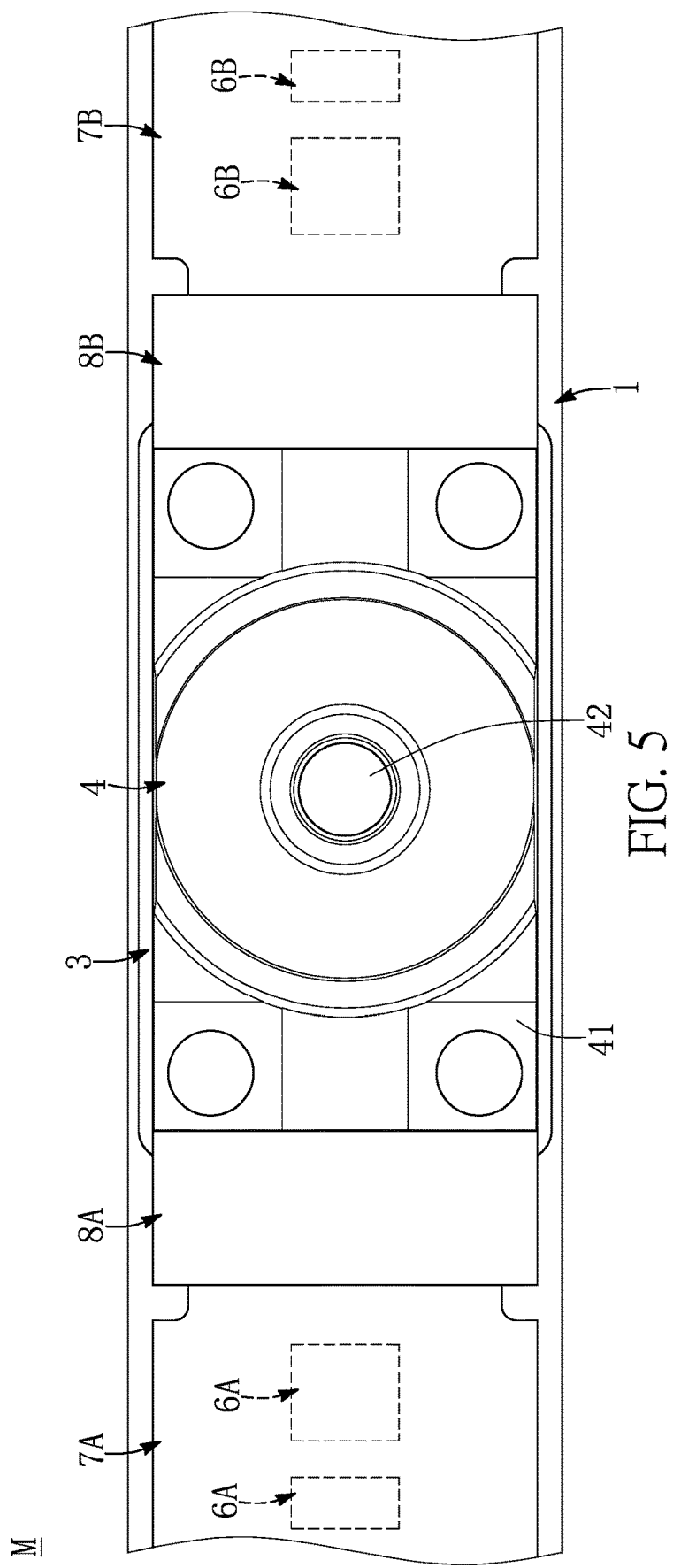
FIG. 5 is a partial schematic top view of the image-capturing module according to the third embodiment of the present disclosure.

Referring to FIG. 4 and FIG. 5, a third embodiment of the present disclosure provides an image-capturing module M, which includes a circuit substrate 1, an image sensing chip 2, a rigidity reinforcing structure 3, and a lens assembly 4. Comparing FIG. 4 with FIG. 1, the main difference between the third embodiment and the first embodiment is as follows: in the third embodiment, the image-capturing module M further includes a plurality of first electronic elements 6A, a plurality of second electronic elements 6B, a first metallic shielding element 7A, a second metallic shielding element 7B, a first insulating filler 8A, and a second insulating filler 8B.

More particularly, referring to FIG. 4 and FIG. 5, the first electronic elements 6A are disposed on the circuit substrate 1 and electrically connected to the circuit substrate 1, and the second electronic elements 6B are disposed on the circuit substrate 1 and electrically connected to the circuit substrate 1. Moreover, the first metallic shielding element 7A is disposed on the circuit substrate 1 for covering or enclosing the first electronic elements 6A, and the second metallic shielding element 7B is disposed on the circuit substrate 1 for covering or enclosing the second electronic elements 6B. In addition, the first insulating filler 8A is disposed on the circuit substrate 1 and connected between the lens holder 41 and the first metallic shielding element 7A, and the second insulating filler 8B is disposed on the circuit substrate 1 and connected between the lens holder 41 and the second metallic shielding element 7B. Hence, when the lens holder 41 of the lens assembly 4 is disposed between the first metallic shielding element 7A and the second metallic shielding element 7B, the lens holder 41 of the lens assembly 4 can be tightly connected between the first insulating filler 8A and the second insulating filler 8B for increasing a fastness of the lens holder 41 of the lens assembly 4 fixed on the rigidity reinforcing structure 3. Therefore, even if the circuit substrate 1 is bent by an external force, the possibility of separating the lens assembly 4 from the image-capturing module M can be decreased by using the rigidity reinforcing structure 3. However, the aforementioned description of the first embodiment is merely an example, and is not meant to limit the scope of the present disclosure.

Fourth Embodiment

Figure 6:
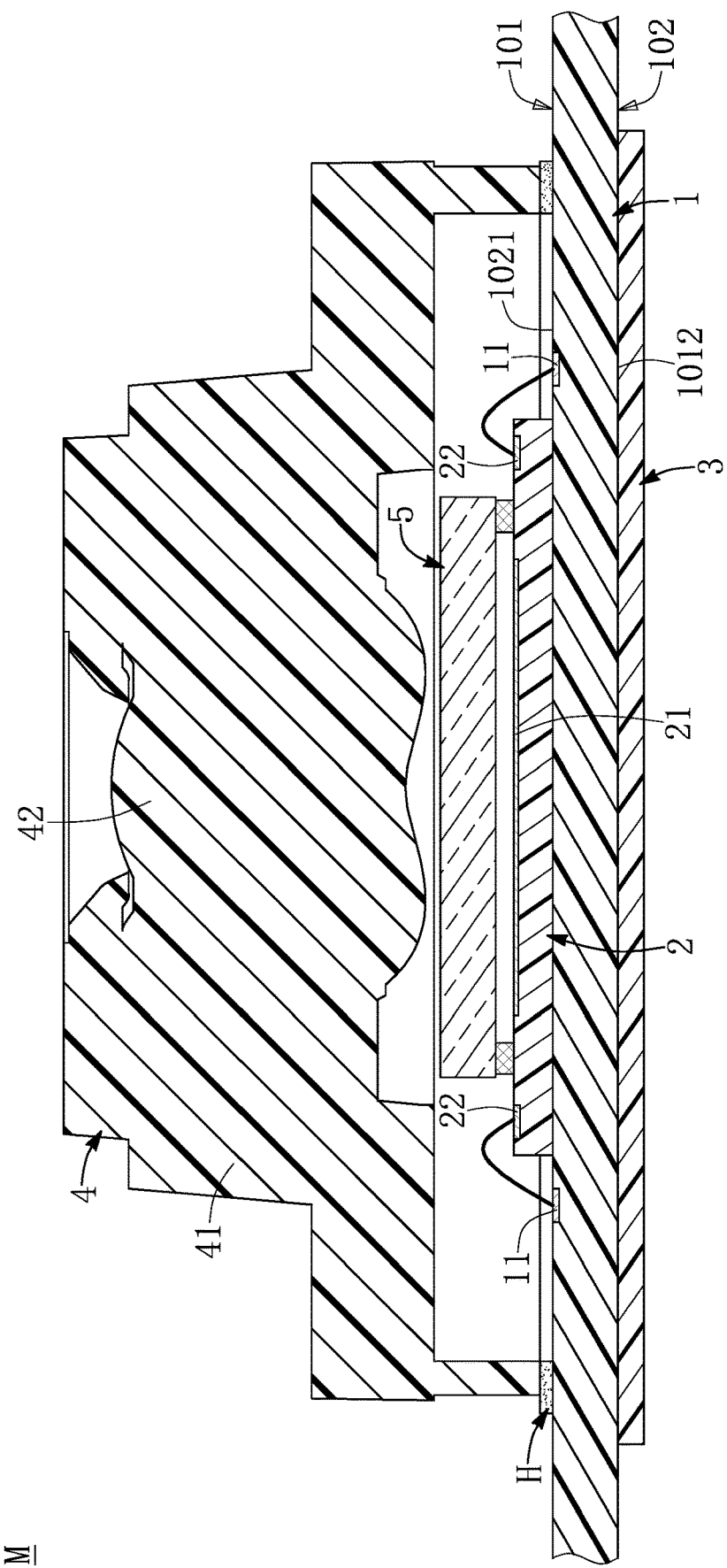
FIG. 6 is a partial schematic cross-sectional view of the image-capturing module according to a fourth embodiment of the present disclosure.

Referring to FIG. 6, a fourth embodiment of the present disclosure provides an image-capturing module M, which includes a circuit substrate 1, an image sensing chip 2, a rigidity reinforcing structure 3, and a lens assembly 4. Comparing FIG. 6 with FIG. 1, the main difference between the fourth embodiment and the first embodiment is as follows: in the fourth embodiment, the conductive substrate contacts 11 are disposed on the top surface 101 of the circuit substrate 1, and the conductive chip contacts 22 of the image sensing chip 2 can be respectively and electrically to the conductive substrate contacts 11 of the circuit substrate 1 through a plurality of conductive wires (not labeled) by wire bonding. For example, the rigidity reinforcing structure 3 without any through hole is disposed on the bottom surface 102 of the circuit substrate 1, and the lens holder 41 of the lens assembly 4 can be adhered to the circuit substrate 1 through an adhesive layer H. However, the aforementioned description of the first embodiment is merely an example, and is not meant to limit the scope of the present disclosure.

More particularly, as shown in FIG. 6, the top surface 101 of the circuit substrate 1 has a surrounding contact region 1021 surrounding the image sensing chip 2 for carrying the conductive substrate contacts 11, the bottom surface 102 of the circuit substrate 1 has a structure reinforcing region 1012 corresponding to the surrounding contact region 1021, and the rigidity reinforcing structure 3 is completely or partially disposed on the structure reinforcing region 1012 so as to increase a structural strength and a surface flatness of the structure reinforcing region 1012 of the circuit substrate 1, and increase a structural strength and a surface flatness of the surrounding contact region 1021 of the circuit substrate 1.

It should be noted that as shown in FIG. 6, a perpendicular projection of the lens holder 41 of the lens assembly 4 can be shown on the rigidity reinforcing structure 3 (such as a perpendicular projection of a surrounding support portion of the lens holder 41 of the lens assembly 4 can be shown on the rigidity reinforcing structure 3), so that a structural stability of the lens holder 41 of the lens assembly 4 can be increased by using the rigidity reinforcing structure 3. Therefore, even if the circuit substrate 1 is bent by an external force, the possibility of separating the lens assembly 4 from the image-capturing module M can be decreased by using the rigidity reinforcing structure 3.

Fifth Embodiment

Figure 7:
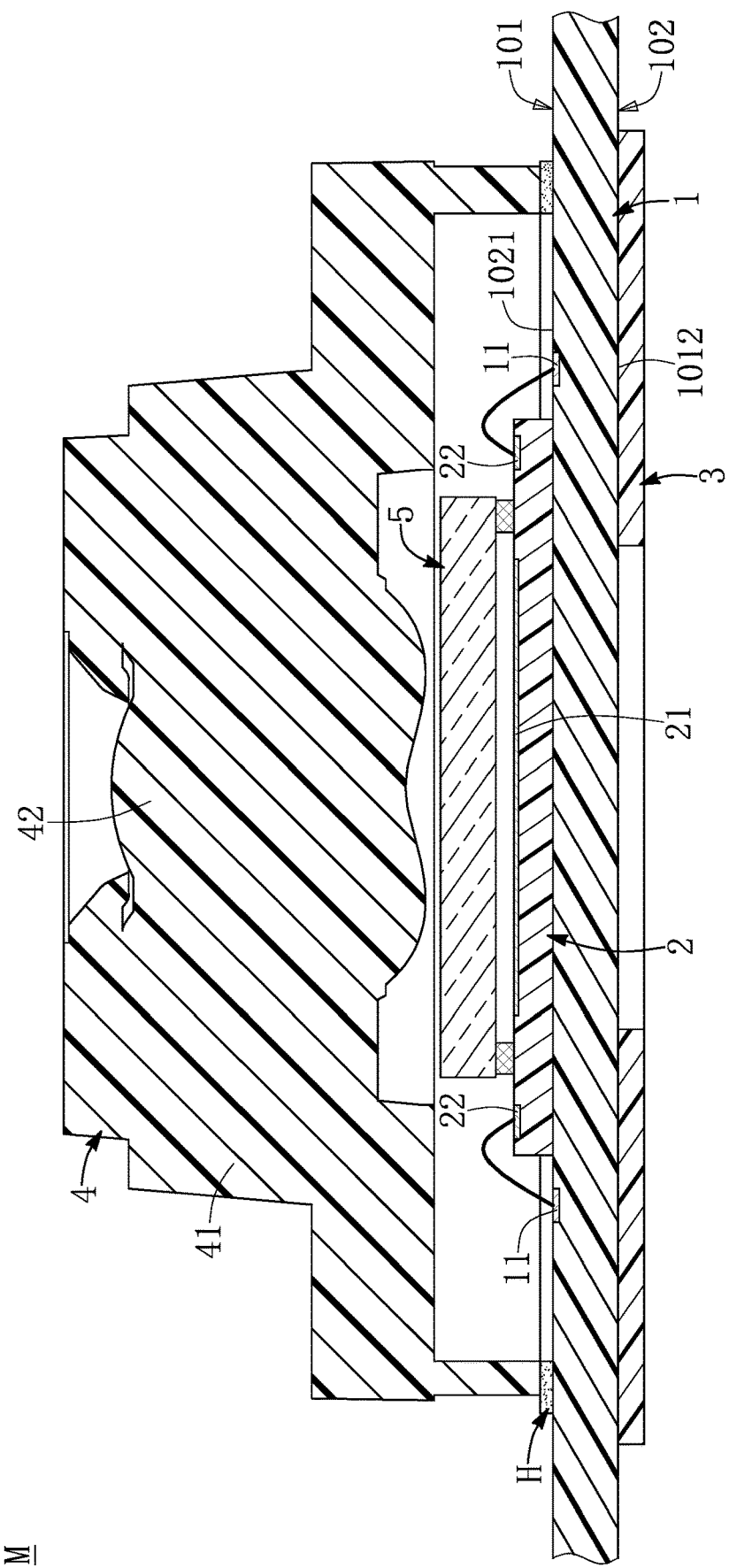
FIG. 7 is a partial schematic cross-sectional view of the image-capturing module according to a fifth embodiment of the present disclosure.

Referring to FIG. 7, a fifth embodiment of the present disclosure provides an image-capturing module M, which includes a circuit substrate 1, an image sensing chip 2, a rigidity reinforcing structure 3, and a lens assembly 4. Comparing FIG. 7 with FIG. 6, the main difference between the fifth embodiment and the fourth embodiment is as follows: in the fifth embodiment, the rigidity reinforcing structure 3 that has a through holes is disposed on the bottom surface 102 of the circuit substrate 1. That is to say, the rigidity reinforcing structure 3 that is disposed on the bottom surface 102 of the circuit substrate 1 can be an entire rigidity reinforcing structure without any through hole (as shown in the fourth embodiment of FIG. 6), or a surrounding rigidity reinforcing structure with a through hole (as shown in the fifth embodiment of FIG. 7).

Sixth Embodiment

Figure 8:
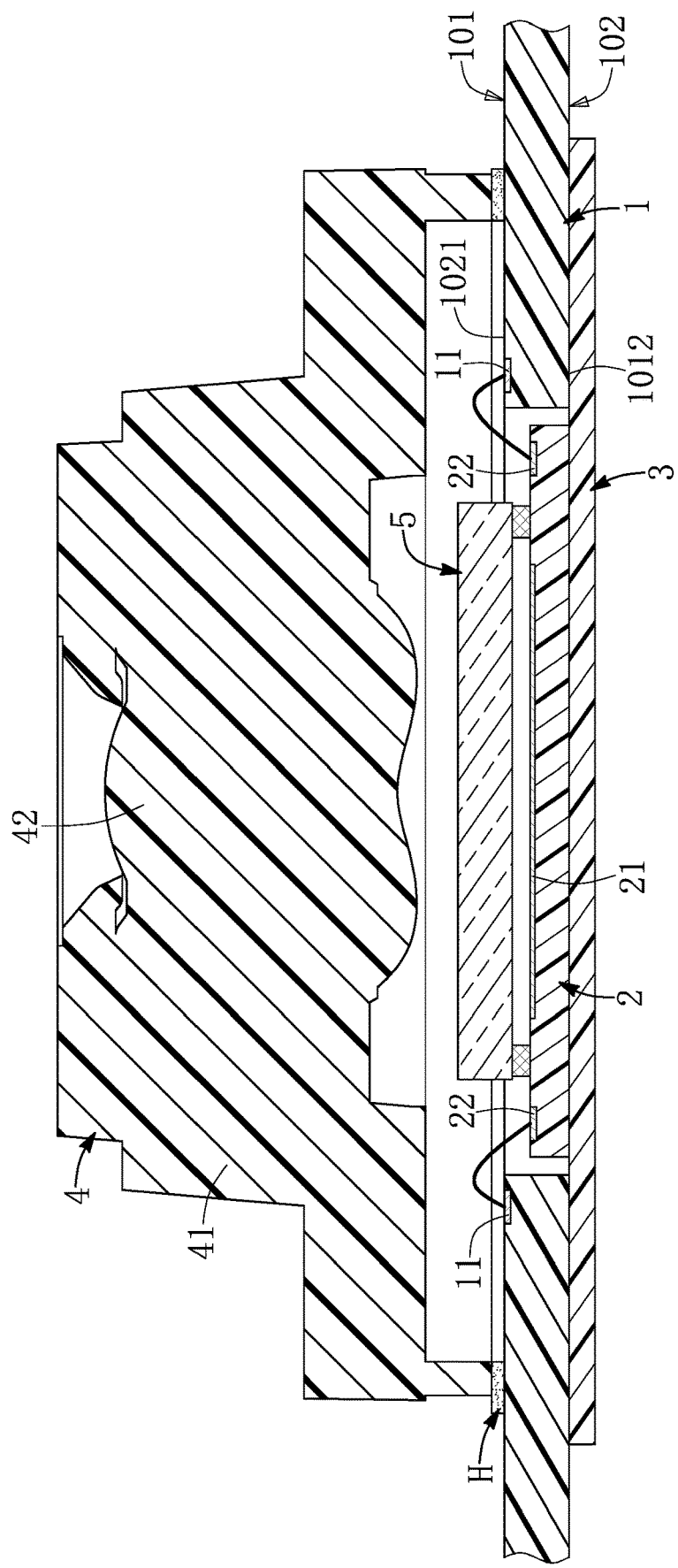
FIG. 8 is a partial schematic cross-sectional view of the image-capturing module according to a sixth embodiment of the present disclosure.

Referring to FIG. 8, a sixth embodiment of the present disclosure provides an image-capturing module M, which includes a circuit substrate 1, an image sensing chip 2, a rigidity reinforcing structure 3, and a lens assembly 4. Comparing FIG. 8 with FIG. 6, the main difference between the sixth embodiment and the fourth embodiment is as follows: in the sixth embodiment, the circuit substrate 1 has a though hole 103 connected between the top surface 101 and the bottom surface 102, and the image sensing chip 2 is received inside the through hole 103 and disposed on the rigidity reinforcing structure 3. It should be noted that, for example, when the rigidity reinforcing structure 3 is made of a conductive material, the heat-dissipating effect of the image sensing chip 2 can be increased by using the rigidity reinforcing structure 3.

Seventh Embodiment

Figure 9:
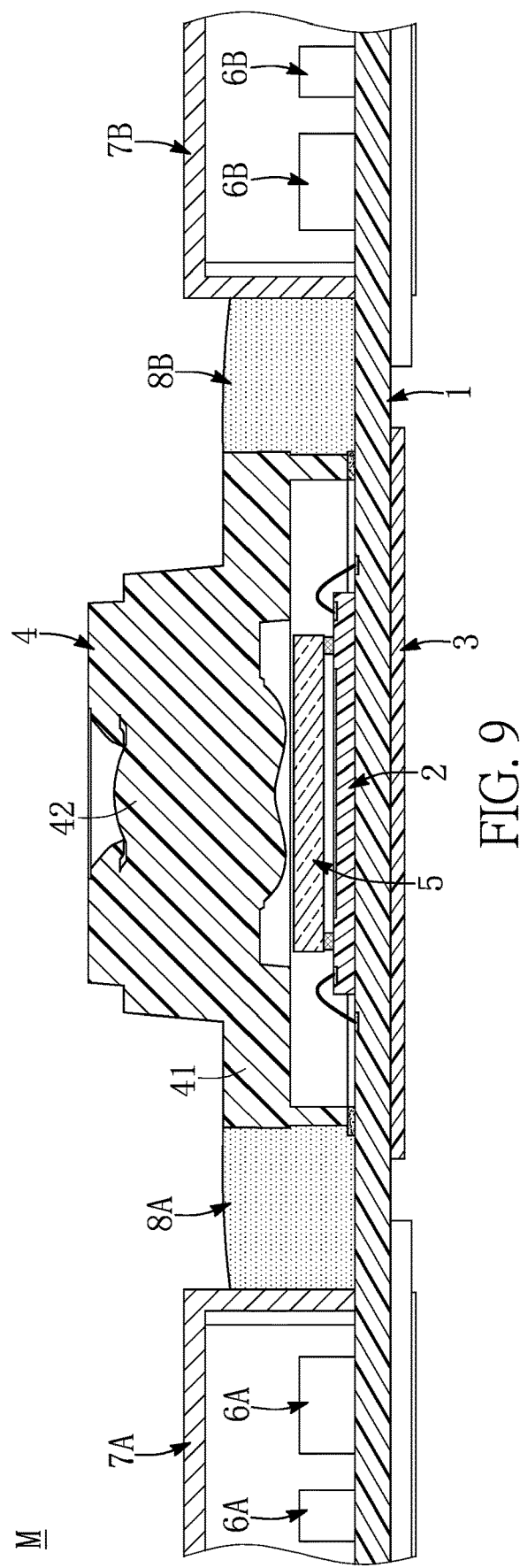
FIG. 9 is a partial schematic cross-sectional view of the image-capturing module according to a seventh embodiment of the present disclosure.
Figure 10:
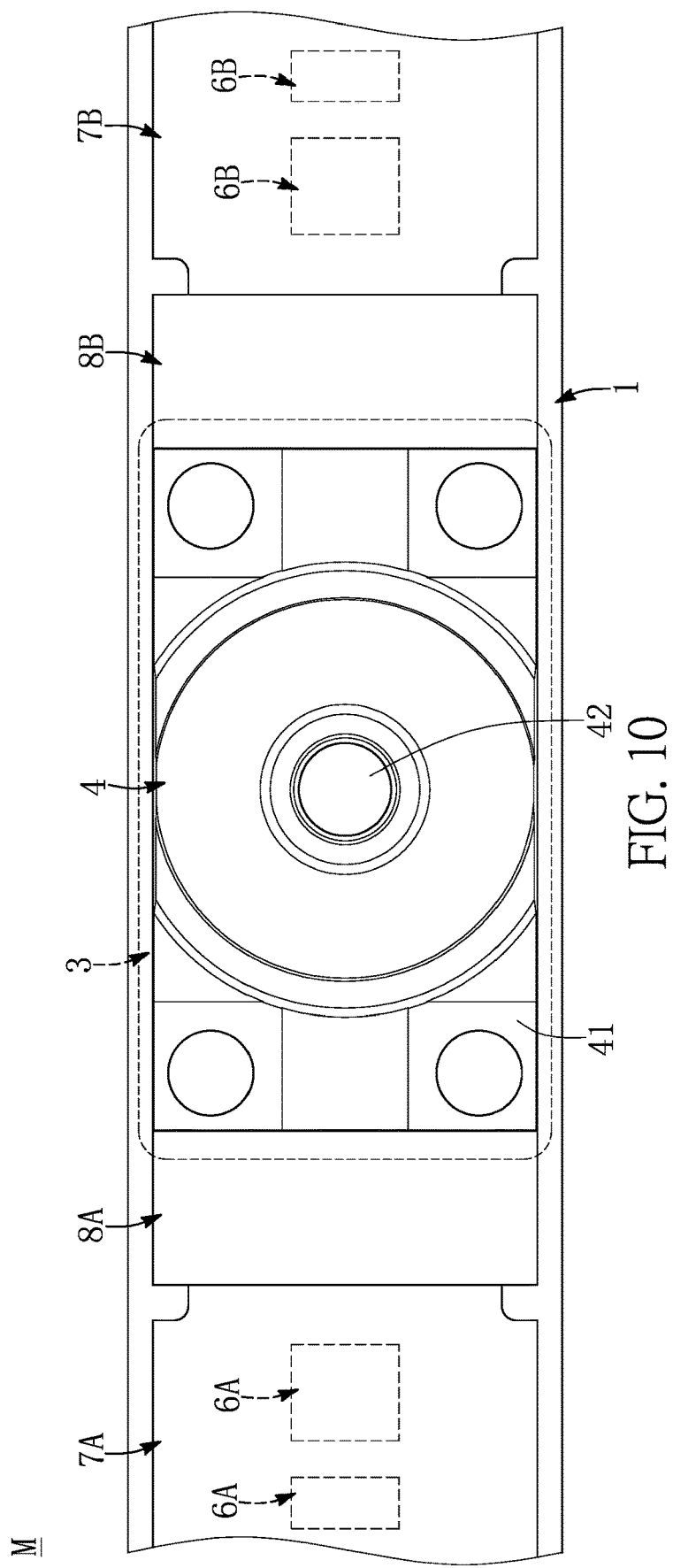
FIG. 10 is a partial schematic top view of the image-capturing module according to the seventh embodiment of the present disclosure.

Referring to FIG. 9 and FIG. 10, a seventh embodiment of the present disclosure provides an image-capturing module M, which includes a circuit substrate 1, an image sensing chip 2, a rigidity reinforcing structure 3, and a lens assembly 4. Comparing FIG. 9 with FIG. 6, the main difference between the seventh embodiment and the fourth embodiment is as follows: in the seventh embodiment, the image-capturing module M further includes a plurality of first electronic elements 6A, a plurality of second electronic elements 6B, a first metallic shielding element 7A, a second metallic shielding element 7B, a first insulating filler 8A, and a second insulating filler 8B.

More particularly, referring to FIG. 9 and FIG. 10, the first electronic elements 6A are disposed on the circuit substrate 1 and electrically connected to the circuit substrate 1, and the second electronic elements 6B are disposed on the circuit substrate 1 and electrically connected to the circuit substrate 1. Moreover, the first metallic shielding element 7A is disposed on the circuit substrate 1 for covering or enclosing the first electronic elements 6A, and the second metallic shielding element 7B is disposed on the circuit substrate 1 for covering or enclosing the second electronic elements 6B. In addition, the first insulating filler 8A is disposed on the circuit substrate 1 and connected between the lens holder 41 and the first metallic shielding element 7A, and the second insulating filler 8B is disposed on the circuit substrate 1 and connected between the lens holder 41 and the second metallic shielding element 7B. Hence, when the lens holder 41 of the lens assembly 4 is disposed between the first metallic shielding element 7A and the second metallic shielding element 7B, the lens holder 41 of the lens assembly 4 can be tightly connected between the first insulating filler 8A and the second insulating filler 8B for increasing a fastness of the lens holder 41 of the lens assembly 4 fixed on the rigidity reinforcing structure 3. Therefore, even if the circuit substrate 1 is bent by an external force, the possibility of separating the lens assembly 4 from the image-capturing module M can be decreased by using the rigidity reinforcing structure 3.

Eighth Embodiment

Figure 11:
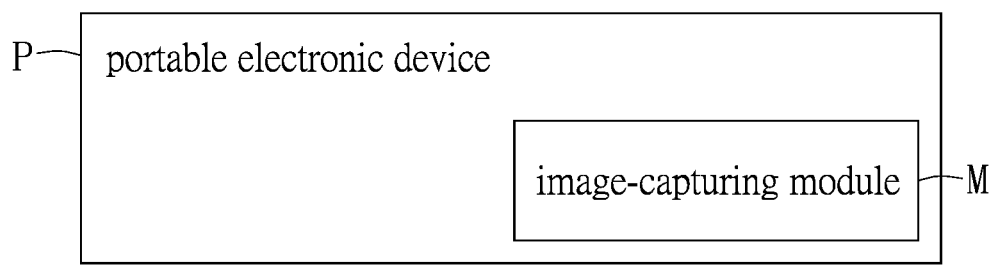
FIG. 11 is a functional block diagram of a portable electronic device according to an eighth embodiment of the present disclosure.

Referring to FIG. 11, an eighth embodiment of the present disclosure provides a portable electronic device P configured for using an image-capturing module M. For example, the image-capturing module M can be selected from the first embodiment to the seventh embodiment, and the portable electronic device P can be a desktop computer, a laptop computer or a tablet computer. However, the aforementioned description of the first embodiment is merely an example, and is not meant to limit the scope of the present disclosure.

Beneficial Effects of the Embodiments

In conclusion, in the portable electronic device P and the image-capturing module M provided by the present disclosure, by virtue of "the rigidity reinforcing structure 3 being disposed on the circuit substrate 1" and "the perpendicular projection of each of the conductive substrate contacts 11 and the perpendicular projection of each of the conductive chip contacts 22 being shown on the rigidity reinforcing structure 3," a structural strength and a surface flatness of a predetermined region (such as a region for carrying the conductive substrate contacts 11) of the circuit substrate 1 can be increased.

More particularly, the rigidity reinforcing structure 3 is completely or partially disposed on the structure reinforcing region 1012 so as to increase the structural strength and the surface flatness of the structure reinforcing region 1012 of the circuit substrate 1, and increase the structural strength and the surface flatness of the surrounding contact region 1021 of the circuit substrate 1. Therefore, even if the circuit substrate 1 is bent by an external force, the possibility of separating each conductive material from the corresponding conductive substrate contact 11 and the corresponding conductive chip contact 22 can be decreased by using the rigidity reinforcing structure 3.

More particularly, the structural stability of the lens holder 41 of the lens assembly 4 can be increased by using the rigidity reinforcing structure 3. Therefore, even if the circuit substrate 1 is bent by an external force, the possibility of separating the lens assembly 4 from the image-capturing module M can be decreased by using the rigidity reinforcing structure 3.

More particularly, the lens holder 41 of the lens assembly 4 can be tightly connected between the first insulating filler 8A and the second insulating filler 8B for increasing a fastness of the lens holder 41 of the lens assembly 4 fixed on the rigidity reinforcing structure 3. Therefore, even if the circuit substrate 1 is bent by an external force, the possibility of separating the lens assembly 4 from the image-capturing module M can be decreased by using the rigidity reinforcing structure 3.

The foregoing description of the exemplary embodiments of the disclosure has been shown only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An image-capturing module, comprising:
a circuit substrate having a plurality of conductive substrate contacts;
an image sensing chip disposed on the circuit substrate and electrically connected to the circuit substrate, wherein the image sensing chip includes an image sensing region, and a plurality of conductive chip contacts respectively and electrically connected to the conductive substrate contacts;
an optical filter element configured to correspond to the image sensing region of the image sensing chip;
a rigidity reinforcing structure disposed on the circuit substrate;
a lens assembly including a lens holder and a lens structure disposed on the lens holder, wherein the lens structure of the lens assembly corresponds to the image sensing region of the image sensing chip;
a plurality of electronic elements disposed on the circuit substrate and electrically connected to the circuit substrate;
a metallic shielding element disposed on the circuit substrate for covering the electronic elements; and
an insulating filler disposed on the circuit substrate and connected between the lens holder and the metallic shielding element;
wherein the optical filter element is separated from the rigidity reinforcing structure;
wherein a perpendicular projection of the optical filter element does not fall on the rigidity reinforcing structure;
wherein the optical filter element is directly disposed on the circuit substrate and contacts the circuit substrate;
wherein a perpendicular projection of each of the conductive substrate contacts and a perpendicular projection of each of the conductive chip contacts are on the rigidity reinforcing structure.

2. The image-capturing module according to claim 1,
wherein the circuit substrate has a top surface, a bottom surface opposite to the top surface, and a through hole connected between the top surface and the bottom surface;
wherein the conductive substrate contacts are disposed on the bottom surface of the circuit substrate, the image sensing chip is disposed on the bottom surface of the circuit substrate, and the conductive chip contacts of the image sensing chip are respectively and electrically to the conductive substrate contacts of the circuit substrate by flip chip bonding;
wherein the rigidity reinforcing structure is surroundingly disposed on the top surface of the circuit substrate and surrounds the through hole, and the lens holder of the lens assembly is adhered to the rigidity reinforcing structure through an adhesive layer;
wherein the rigidity reinforcing structure has an outer surrounding periphery, and the outer surrounding periphery of the rigidity reinforcing structure is covered or exposed by the lens holder;
wherein the top surface of the circuit substrate has a surrounding unoccupied region connected to the through hole and surrounding the through hole, and the surrounding unoccupied region of the top surface of the circuit substrate is surrounded and exposed by the rigidity reinforcing structure;
wherein the bottom surface of the circuit substrate has a surrounding contact region surrounding the through hole for carrying the conductive substrate contacts, the top surface of the circuit substrate has a structure reinforcing region surrounding the surrounding unoccupied region and corresponding to the surrounding contact region, and the rigidity reinforcing structure is completely or partially disposed on the structure reinforcing region so as to increase a structural strength and a surface flatness of the structure reinforcing region of the circuit substrate, and a structural strength and a surface flatness of the surrounding contact region of the circuit substrate.

3. A portable electronic device configured for using an image-capturing module, wherein the image-capturing module comprises:
a circuit substrate having a plurality of conductive substrate contacts;
an image sensing chip disposed on the circuit substrate and electrically connected to the circuit substrate, wherein the image sensing chip includes an image sensing region, and a plurality of conductive chip contacts respectively and electrically connected to the conductive substrate contacts;
an optical filter element configured to correspond to the image sensing region of the image sensing chip;
a rigidity reinforcing structure disposed on the circuit substrate;
a lens assembly including a lens holder and a lens structure disposed on the lens holder, wherein the lens structure of the lens assembly corresponds to the image sensing region of the image sensing chip;
a plurality of electronic elements disposed on the circuit substrate and electrically connected to the circuit substrate;
a metallic shielding element disposed on the circuit substrate for covering the electronic elements; and
an insulating filler disposed on the circuit substrate and connected between the lens holder and the metallic shielding element;
wherein the optical filter element is separated from the rigidity reinforcing structure;
wherein a perpendicular projection of the optical filter element does not fall on the rigidity reinforcing structure;
wherein the optical filter element is directly disposed on the circuit substrate and contacts the circuit substrate;
wherein a perpendicular projection of each of the conductive substrate contacts and a perpendicular projection of each of the conductive chip contacts are on the rigidity reinforcing structure.

4. The portable electronic device according to claim 3,
wherein the circuit substrate has a top surface, a bottom surface opposite to the top surface, and a through hole connected between the top surface and the bottom surface;
wherein the conductive substrate contacts are disposed on the bottom surface of the circuit substrate, the image sensing chip is disposed on the bottom surface of the circuit substrate, and the conductive chip contacts of the image sensing chip are respectively and electrically to the conductive substrate contacts of the circuit substrate by flip chip bonding;
wherein the rigidity reinforcing structure is surroundingly disposed on the top surface of the circuit substrate and surrounds the through hole, and the lens holder of the lens assembly is adhered to the rigidity reinforcing structure through an adhesive layer;
wherein the rigidity reinforcing structure has an outer surrounding periphery, and the outer surrounding periphery of the rigidity reinforcing structure is covered or exposed by the lens holder;
wherein the top surface of the circuit substrate has a surrounding unoccupied region connected to the through hole and surrounding the through hole, and the surrounding unoccupied region of the top surface of the circuit substrate is surrounded and exposed by the rigidity reinforcing structure;
wherein the bottom surface of the circuit substrate has a surrounding contact region surrounding the through hole for carrying the conductive substrate contacts, the top surface of the circuit substrate has a structure reinforcing region surrounding the surrounding unoccupied region and corresponding to the surrounding contact region, and the rigidity reinforcing structure is completely or partially disposed on the structure reinforcing region so as to increase a structural strength and a surface flatness of the structure reinforcing region of the circuit substrate, and a structural strength and a surface flatness of the surrounding contact region of the circuit substrate.

* * * * *